United States Patent
Pei

(10) Patent No.: US 9,490,454 B2
(45) Date of Patent: Nov. 8, 2016

(54) METHOD FOR PRODUCING A HIGH EFFICIENCY ORGANIC LIGHT EMITTING DEVICE HAVING A TRANSPARENT COMPOSITE ELECTRODE COMPRISING A FILM OF CONDUCTIVE NANOWIRES, CARBON NANOPARTICLES, LIGHT SCATTERING NANOPARTICLES, AND A POLYMER SUPPORT

(71) Applicant: THE REGENTS OF THE UNIVERSITY OF CALIFORNIA, Oakland, CA (US)

(72) Inventor: Qibing Pei, Calabasas, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/600,194

(22) Filed: Jan. 20, 2015

(65) Prior Publication Data

US 2015/0207106 A1    Jul. 23, 2015

Related U.S. Application Data

(63) Continuation of application No. PCT/US2013/051349, filed on Jul. 19, 2013.

(60) Provisional application No. 61/674,197, filed on Jul. 20, 2012.

(51) Int. Cl.
*H01L 29/08* (2006.01)
*H01L 51/52* (2006.01)
(Continued)

(52) U.S. Cl.
CPC ........... *H01L 51/5268* (2013.01); *B82Y 10/00* (2013.01); *H01L 51/0037* (2013.01);
(Continued)

(58) Field of Classification Search
CPC ........... H01L 51/5268; H01L 51/0048; H01L 51/5012; H01L 51/5032; H01L 51/5056; H01L 51/5206; H01L 51/5215; H01L 51/56; H01L 51/5016; H01L 2251/5338; H01L 2251/5369; B82Y 10/00
USPC ........................................................... 257/40
See application file for complete search history.

(56) References Cited

U.S. PATENT DOCUMENTS

| 7,170,481 B2 | 1/2007 | Doane et al. |
| 2008/0259262 A1 | 10/2008 | Jones et al. |

(Continued)

FOREIGN PATENT DOCUMENTS

| WO | 2007004758 | 1/2007 |
| WO | 2007/022226 | 2/2007 |

(Continued)

OTHER PUBLICATIONS

Day. T. M. et al., in "Electrochemical Templating of Metal Nanoparticles and Nanowires on Single-Walled Carbon Nanotube Networks," (2005), J. Am. Chem. Soc., vol. 127, pp. 10639-10647.*

(Continued)

*Primary Examiner* — Xinning Niu
*Assistant Examiner* — Vu A Vu
(74) *Attorney, Agent, or Firm* — Gates & Cooper LLP

(57) ABSTRACT

A method for producing high efficiency organic light emitting devices, that have an organic semiconductor active layer sandwiched between electrodes where at least one of the electrodes is a film of conductive nanowires, carbon nanoparticles, light scattering nanoparticles and a polymer support. The light scattering nanoparticles can be incorporated in the conductive nanowires, carbon nanoparticle or polymer support elements of the electrode. The second electrode can be identical to the first to provide a symmetrical device or can be a conductive paste or metal layer. The entire process, including the formation of both of the electrodes, the emissive polymer layer, and the substrate, may be carried out by solution processing.

20 Claims, 5 Drawing Sheets

(51) Int. Cl.
*H01L 51/00* (2006.01)
*B82Y 10/00* (2011.01)
*H01L 51/50* (2006.01)
*H01L 51/56* (2006.01)

(52) U.S. Cl.
CPC ....... *H01L51/0048* (2013.01); *H01L 51/5012* (2013.01); *H01L 51/5032* (2013.01); *H01L 51/5056* (2013.01); *H01L 51/5206* (2013.01); *H01L 51/5215* (2013.01); *H01L 51/56* (2013.01); *H01L 51/5016* (2013.01); *H01L 2251/5338* (2013.01); *H01L 2251/5369* (2013.01)

(56) References Cited

U.S. PATENT DOCUMENTS

| | | | |
|---|---|---|---|
| 2010/0028656 | A1 | 2/2010 | Kim et al. |
| 2010/0075447 | A1 | 3/2010 | Lee et al. |
| 2010/0307589 | A1* | 12/2010 | Choi ............... H01L 51/4253 136/261 |
| 2011/0156577 | A1 | 6/2011 | Koyama et al. |
| 2011/0281070 | A1* | 11/2011 | Mittal ............. H01L 31/022466 428/142 |
| 2012/0098419 | A1* | 4/2012 | Chiba ................ H01L 51/5206 313/504 |
| 2013/0089735 | A1* | 4/2013 | Kim ........................ B05D 1/18 428/367 |
| 2013/0251943 | A1 | 9/2013 | Pei |
| 2014/0004371 | A1* | 1/2014 | Chung ..................... H01B 1/02 428/549 |

FOREIGN PATENT DOCUMENTS

| | | |
|---|---|---|
| WO | 2008-131304 | 10/2008 |
| WO | 2010/010838 | 1/2010 |
| WO | 2012/040637 | 3/2012 |

OTHER PUBLICATIONS

Chen, P. C. et al. in "Nanowire/Single-Walled Carbon Nanotube Hybrid Thin-Film Electrodes," (2010), American Chemical Society. vol. 4, No. 8, pp. 4403-4411.*

Gao, C. et al. in "Facile and large-scale synthesis and characterization of carbon nanotube/silver nanocrystal nanohybrids," (2006), Nanotechnology, vol. 17, pp. 2882-2890.*

Govindaraj. A. et al. in "Metal Nanowires and Intercalated Metal Layers in Single-WAlled Carbon Nanotube Bundles," (2000), Chem. Mater. vol. 12, pp. 202-205.*

Lee, J.Y. et al. in "Solution-Processed Metal Nanowire Mesh Transport Electrode," (2007), Nano Leters, vol. 8, No. 2, pp. 689-692.*

Sun, S. et al. in "Synthesis and Characterization of Platinum Nanowire-Carbon nanotube heterostructures," (2007), Chem. Mater. vol. 19, pp. 6376-6378.*

Chinese Office Action (with English translation) dated Dec. 8, 2015 for Chinese Patent Application No. 201180044909.1.

Hu et al., "Scalable Coating and Properties of Transparent, Flexible, Silver Nanowire Electrodes", Acs Nano, Apr. 28, 2010, 4 (5), pp. 2955-2963.

Zeng et al. "A new transparent conductor: silver nanowire film buried at the surface of a transparent polymer," Advanced Materials, Aug. 3, 2010, pp. 4484-4488.

Korean Intellectual Property Office, International Search Report and Written Opinion (pp. 1-8), Issued on Apr. 13, 2012 for corresponding International Patent Application No. PCT/US2011/053107, with claims searched (pp. 9-13) pp. 1-13.

Korean Intellectual Property Office, International Search Report and Written Opinion issued on Oct. 18, 2013 for related International Patent Application No. PCT/US2013/051349 (International Publication No. WO 2012/040637) (pp. 1-13), with claims searched (pp. 13-17) pp. 1-17.

European Patent Office, European Supplemental Search Report, issued on May 9, 2014 in corresponding European Patent Application No. 11827658.3 (International Patent Application No. PCT/US2011/053107) (pp. 1-7) with pending claims (pp. 8-9) pp. 1-9.

The Patent Office of the People's Republic of China, The First Office Action, CN application No. 201180044909.1, issued Dec. 29, 2014 (pp. 1-13), with claims examined (pp. 14-19), counterpart to U.S. Appl. No. 13/783,284 herein.

The State Intellectual Property Office of the People's Republic of China, Notification of 2nd Office Action, issued Jul. 20, 2015 (pp. 1-13), with claims examined (pp. 14-19), counterpart to U.S. Appl. No. 13/783,284 herein.

* cited by examiner

METHOD FOR PRODUCING A HIGH EFFICIENCY ORGANIC LIGHT EMITTING DEVICE HAVING A TRANSPARENT COMPOSITE ELECTRODE COMPRISING A FILM OF CONDUCTIVE NANOWIRES, CARBON NANOPARTICLES, LIGHT SCATTERING NANOPARTICLES, AND A POLYMER SUPPORT

CROSS-REFERENCE TO RELATED APPLICATIONS

This application is a 35 U.S.C. §111(a) continuation of PCT international application number PCT/US2013/051349 filed on Jul. 19, 2013, incorporated herein by reference in its entirety, which claims priority to, and the benefit of, U.S. provisional patent application Ser. No. 61/674,197 filed on Jul. 20, 2012, incorporated herein by reference in its entirety. Priority is claimed to each of the foregoing applications.

STATEMENT REGARDING FEDERALLY SPONSORED RESEARCH OR DEVELOPMENT

This invention was made with Government support under ECCS-1028412, awarded by the National Science Foundation and Grant No. FA9550-12-1-0074 awarded by the Air Force Office of Scientific Research. The Government has certain rights in the invention.

The above-referenced PCT international application was published as PCT International Publication No. WO 2014/015284 on Jan. 23, 2014, which publication is incorporated herein by reference in its entirety.

INCORPORATION-BY-REFERENCE OF MATERIAL SUBMITTED ON A COMPACT DISC

Not Applicable

BACKGROUND

1. Technical Field

This technology pertains generally to organic light-emitting devices (OLEDs) and methods of fabrication, and more particularly to low cost methods for fabricating flexible, transparent devices with at least one nanotube-nanowire-polymer composite electrode producing OLEDs with enhanced emission efficiency.

2. Background Discussion

Organic light-emitting diodes (OLEDs) have emerged as an important technology for flat panel displays and solid state lighting. In addition to high efficiencies that can surpass that of fluorescent tubes, one of the most attractive advantages of the OLEDs have been their potential to be produced through solution-based processes at ambient temperature and pressure that are compatible with roll-to-roll manufacturing, large areas, and flexible form factors. However, some of the originally perceived major advantages of OLEDs have not been fully realized in commercial products.

Early attempts at producing flexible OLEDs used indium-doped tin oxide (ITO) as the conductive layer coated on glass or plastic substrate. However, the flexibility of these devices is limited by the glass substrate or by the ITO coating. In addition, flexible OLEDs based on ITO/plastic substrate have exhibited generally low performance and rather limited flexibility. High performance OLEDs that are generally fabricated on ITO/glass and are not flexible. Furthermore, the emission efficiency of OLEDs is limited due to waveguiding in the ITO layer as well as the substrate layer.

Conventional OLEDs also employ a cathode that is deposited by physical vapor deposition in a high vacuum which is costly. Vapor deposition methods such as plasma vapor deposition (PVD) or chemical deposition (CVD) schemes require complicated equipment and a substantial capital investment, greatly increasing the cost of the device fabrication process. In addition, the materials available for use in conventional vapor deposition processes are limited to mainly metal oxides or mixed metal oxides, such as indium-tin mixed oxide (ITO), antimony-tin mixed oxide (ATO), fluorine-doped tin oxide (FTO), and aluminum-doped zinc oxide (Al—ZO). Unfortunately electrodes produced from these metal oxide materials are found to be brittle and adhesion to the substrate is poor. Such electrodes do not survive repeated deformations.

Accordingly, there are several key challenges that have yet to be overcome for all-solution processing: 1) the limited selection of a transparent anode. ITO coating requires a high vacuum and high temperatures. While several alternative technologies have been studied, none of them can match the performance of ITO/glass. 2) The cathode generally uses low-work-function metals such as aluminum (Al) deposited by physical vapor deposition in high vacuum. 3) For efficient injections of charge carriers, the emissive organic layer has to be thinner than 100 nm, and multiple layers are preferred, which make all-solution processing rather difficult.

There is a need for organic light-emitting devices with improved efficiency as well as all-solution processing methods of manufacture of flexible, transparent devices that do not require costly vacuum deposition processes. The technology described below satisfies these needs as well as others and is generally an improvement over the art.

SUMMARY OF THE DISCLOSURE

Generally, the technology described herein provides transparent composite electrodes that are particularly suitable for organic light-emitting devices. The devices have at least one electrode preferably comprising a layer of dense single-walled carbon nanotubes (SWCNT) and a layer of sparse metal nanowires (e.g. AgNW) stacked and embedded in the surface layer of a poly(urethane acrylate) matrix (substrate), as an illustration. The dense carbon nanotube layer in the outer surface layer of the composite electrode provides a large contact area for efficient charge injection into an electroluminescent polymer active layer, for example.

The underlying metal nanowires form a highly conductive percolation network for long-range electrical conduction. The composite electrode has been shown to exhibit a figure-of-merit conductivity-transmittance comparable to that of indium tin oxide (ITO) coated on glass, and a low surface roughness suitable for the fabrication of thin film electronic devices.

This bilayer SWCNT/AgNW-polymer composite electrode has been used as the anode/substrate to fabricate high-performance yellow and red polymer light-emitting electrochemical cells (PLEC) devices to illustrate the methods.

In various embodiments, light scattering nanoparticles such as nanoparticles of $BaSrTiO_3$ are included in at least one of the layers of carbon nanotubes, conductive nanowires or polymer support.

Polymer light-emitting electrochemical cells (LECs) are devices that employ a single layer of conjugated polymer sandwiched between two contact electrodes. The polymer layer comprises of a blend of a light-emitting conjugated polymer and an ionic-conducting electrolyte, and can form in situ light-emitting p-i-n junction when an external voltage is applied. This junction formation at the electrode interfaces allows the efficient and balanced injections of electrons and holes regardless of the work-function of the electrodes. Thus, solution-based materials such as industrial silver paste thus can be deposited using rod-coating as the cathode. Moreover, compared to conventional OLEDs, a thicker active polymer layer may be employed in the LECs such that large-area coating techniques such as rod and blade coating may be used. Additionally, the recent progresses in improving the performance and lifetime of the LECs with simple configuration have made the LECs a vital technology for product development. Therefore, it is highly desirable to develop an all-solution processing technique for the large-area, low-cost fabrication of the LECs.

The method for all-solution processed red PLECs was demonstrated through first depositing an electroluminescent polymer layer on the composite electrode by blade or spin-coating, followed by blade coating a layer of printing silver paste as the top electrode. The entire process, including the formation of both electrodes, the emissive polymer layer, and the substrate, is carried out by solution processing. Electroluminescent performance of the all-solution processed red PLECs is higher than control devices on ITO/glass and using evaporated Al cathode.

Red and yellow polymer light-emitting electrochemical cells (PLECs) fabricated on the composite electrode as anode and aluminum as cathode show improved and stable electroluminescent efficiency compared with control devices on ITO/glass. Red PLECs have also been fabricated employing rod-coated silver paste as the cathode. The all-solution processed PLECs exhibit higher performance than control devices fabricated on ITO/glass and using evaporated aluminum as the cathode.

According to one aspect of the technology, an apparatus and method are provided for the production of high efficiency organic light emitting devices that are transparent and flexible and formed with an all solution process.

According to another aspect of the technology, high efficiency organic light emitting devices are produced that have light-scattering particles in the polymer matrix or the conductive nanowire layer or the carbon layer of the device at sizes and concentrations that increase the efficiency of the device.

Further aspects of the technology will be brought out in the following portions of the specification, wherein the detailed description is for the purpose of fully disclosing preferred embodiments of the technology without placing limitations thereon.

BRIEF DESCRIPTION OF THE DRAWINGS

The technology of this disclosure will be more fully understood by reference to the following drawings which are for illustrative purposes only.

DETAILED DESCRIPTION

Referring more specifically to the drawings, for illustrative purposes several embodiments of the materials and methods for producing the light emitting devices of the technology of this disclosure are depicted generally in FIG. 1 through FIG. 5. It will be appreciated that the methods may vary as to the specific steps and sequence and the formulations may vary as to structural details, without departing from the basic concepts as disclosed herein. The method steps are merely exemplary of the order that these steps may occur. The steps may occur in any order that is desired, such that it still performs the goals of the claimed technology.

The technology relates to devices and methods for manufacturing transparent and flexible organic light-emitting devices with at least one metal nanowire-carbon nanotube polymer composite electrode with very smooth active surfaces and an active layer. Generally, the light emitting devices that can be produced with the methods have an electrode of a metal nanowire film and a single walled nanotube film on a polymer matrix base. An active layer is disposed between the nanotube film and a second electrode in the typical structure.

Figure 1:
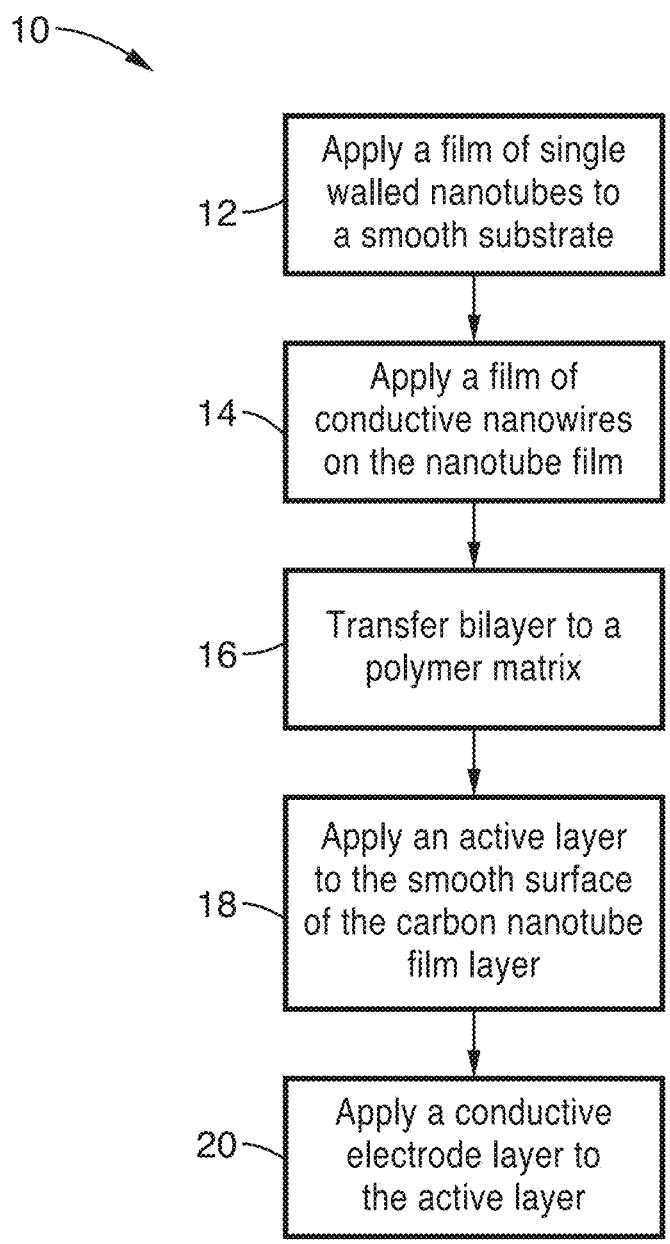
FIG. 1 is a flow diagram of the all-solution fabrication process for producing a bilayer polymer composite electrode and a LEC device according to one embodiment of the technology described herein.

Turning now to FIG. 1, a flow diagram for one method 10 for manufacturing a polymer light-emitting electrochemical cell (PLEC) with a single walled carbon nanotube and metal nanowires bilayer composite electrode is schematically shown. At block 12 of FIG. 1, a smooth substrate is provided and a film of single walled carbon nanotubes is applied on the smooth surface of the substrate to form at least one layer of carbon nanotubes. The film of single walled carbon nanotubes preferably ranges in thickness from approximately 10 nm to approximately 100 nm. Although single walled carbon nanotubes are preferred for the deposition of the carbon nanoparticle layer at block 12, other carbon nanoparticles of graphite powder, graphenes, and double walled carbon nanotubes can also be used.

Suitable substrates with smooth surfaces on which the conductive carbon nanotube layer is formed include glass, silicon wafer, polymer sheet, or metal in planar sheets or drums. Preferably, such platforms provide a surface with roughness of less than 10 nm and a soften point higher than 200° C. Glass sheets or silicon wafers are particularly preferred.

A film of conductive nanoparticles is then applied to the top surface of the single walled nanotube layer at block 14 of FIG. 1. The film that is deposited on the carbon nanotube layer is preferably made from metal nanowires. The deposited nanowires preferably range in the amount of nanowires coated over 1 square meter of area from approximately 10 mg/m$^2$ to approximately 100 mg/m$^2$. Suitable metal nanowires include metals such as silver, copper, aluminum, gold, nickel, stainless steel as well as nanowires of a conducting polymer such as polypyrrole, polyaniline, polythiophene, poly(3-methylthiophene), poly(3,4-ethylenedioxythiophene), or nanotubes or nanowires of a ceramic conductor such as indium doped tin oxide. Preferred nanomaterials can also include combinations of two or more types of nanowires, such as combinations of silver nanowires with copper nanowires or gold nanowires and are also contemplated.

Suitable methods for forming a nanowire coating on the carbon nanotubes at block 14 is by drop casting, dip coating, inkjet printing, screen printing, Stylus plotting, Meyer rod or doctor blade coating, slot coating, flow coating, gravure printing or spraying. One preferred embodiment of forming is by spray coating especially by a sonication spray coating process. During the sonication spray process, the formulation of the nanowires is sonicated in-situ when it leaves the spray nozzle. The solvent is mostly evaporated when the nanowires hit the surface of the nanotube layer preventing re-agglomeration.

In another embodiment, a treatment of the nanowire coating on the nanotube layer is conducted at block 14. Suitable treatment methods for the nanowire layer include thermal annealing, plasma treatment, UV or other irradiative treatment. The purpose of the treatment is to minimize the contact resistance between the nanowires and to enhance the conductivity. A thermal annealing process is particularly preferred. The temperature for annealing is preferably at least 80° C. and more preferably at least 120° C. for a certain period of time, preferably for less than 60 minutes. In addition, the annealing temperature is selected below the decomposing temperature of the optional mold release agent, and more preferably at a temperature below 300° C.

At block 16, the bilayer of single walled carbon nanotubes and conductive nanowires that was produced at block 14 is removed from the smooth substrate and transferred to a polymer matrix. The bilayer combination has a smooth bottom side that is the carbon nanotube layer and a top side that is the conductive metal layer. In the preferred embodiment, the bilayer is transferred to a polymer matrix, such that the carbon nanotube layer is partially exposed on the surface of the polymer matrix and the conductive metal layer is buried underneath the carbon nanotube layer.

In another embodiment, at least one type of monomer is then applied to diffuse into the bilayer and is thereafter polymerized in-situ to form a polymer film-bilayer composite. Suitable monomers include monomer of an acrylate ester, a methacrylate ester, an acrylic acid, a methacrylic acid, an acrylamide, a methacrylamide, a styrene, a methyl styrene, an epoxide, a diacrylate, a dimethacrylate, an oligomer of acrylate, an oligomer of methacrylate, and mixtures thereof.

After polymerization, the composite of polymer layer, conductor layer and carbon nanotube layer is removed from the smooth substrate. In one embodiment, the surface of the composite film that is removed from the surface of the platform is smooth with surface height variations of 20 nm or less. In another embodiment, the surface of the composite film that is removed from the surface of the platform is smooth with surface height variations of 10 nm or less.

In one preferred embodiment, light-reflective nanoparticles are mixed with the monomers that produce the polymer matrix that is used at block 16. It has been observed that the efficiency of the final devices continuously increases with increasing concentrations of light-reflective nanoparticles even though the composite electrode is fairly opaque at higher concentrations. The enhancement is due to light scattering effect due to the presence of the particles.

Nanoparticles of $BaSrTiO_3$ ranging in size from approximately 10 nm to 10 μm are particularly preferred. The concentrations of light-reflective nanoparticles can be optimized for the type of particle that is used and the nature of the device that is to be produced. Concentrations of nanoparticles ranging from approximately 0.1 wt % $BaSrTiO_3$ to approximately 1.0 wt % $BaSrTiO_3$ to polymer produce satisfactory efficiency improvements.

In another embodiment, the light-reflective nanoparticles of similar sizes are included in the dispersion of conductive nanowires and deposited with the nanowire layer at block 14. In another embodiment, the light-reflective nanoparticles are added into the solution/dispersion of the carbon nanotubes in the initial layer that is deposited on the smooth substrate at block 12. In a further embodiment the polymer matrix contains dispersed light scattering nanoparticles that absorb light at one wavelength and re-emit light at a longer wavelength.

An active layer is then applied to the smooth carbon nanotube surface of the composite at block 18 of FIG. 1. The active layer is a functional layer such as an electroluminescent organic compound or polymer layer. The active layer can also be a stack of more than one electroactive layers such as a hole-injection layer, an electroluminescent layer, and an electron-injection layer. The active layer can also comprise a blend of a hole-injection organic compound or polymer, a light-emitting organic compound or polymer, and an electron-conducting organic compound or polymer. The active layer can also comprise a blend of a light-emitting conjugated polymer and an ionic-conducting electrolyte.

The active layer is covered with a second conductive electrode layer at block 20 of FIG. 1. In the preferred embodiment, the active layer is coated with a coating of conductive silver paste. In another preferred embodiment, the active layer is covered with a second polymer-bilayer composite electrode.

This technology provides a substrate that can significantly increase the efficiency of organic or polymer light emitting devices (OLEDs). The experimentally determined external quantum efficiency of the devices using the conventional ITO/glass as substrate has been limited to less than 25%. The loss of the produced photons is attributed to the total internal reflection in the organic and indium-tin oxide (ITO) layers, the substrate (glass), and quenching at the organic/cathode interface of the OLEDs. The present substrate can overcome much of these optical losses. Admixing reflective particles, such as the nanoparticles of titanium oxide, silicon oxide, barium titanate, barium strontium titanate, and likes, could further reduce internal light losses and increase the light extraction efficiency of OLEDs.

The technology of this disclosure may be better understood with reference to the accompanying examples, which are intended for purposes of illustration only and should not be construed in any sense as limiting the scope of the technology as defined in the claims appended hereto.

EXAMPLE 1

Figure 2:
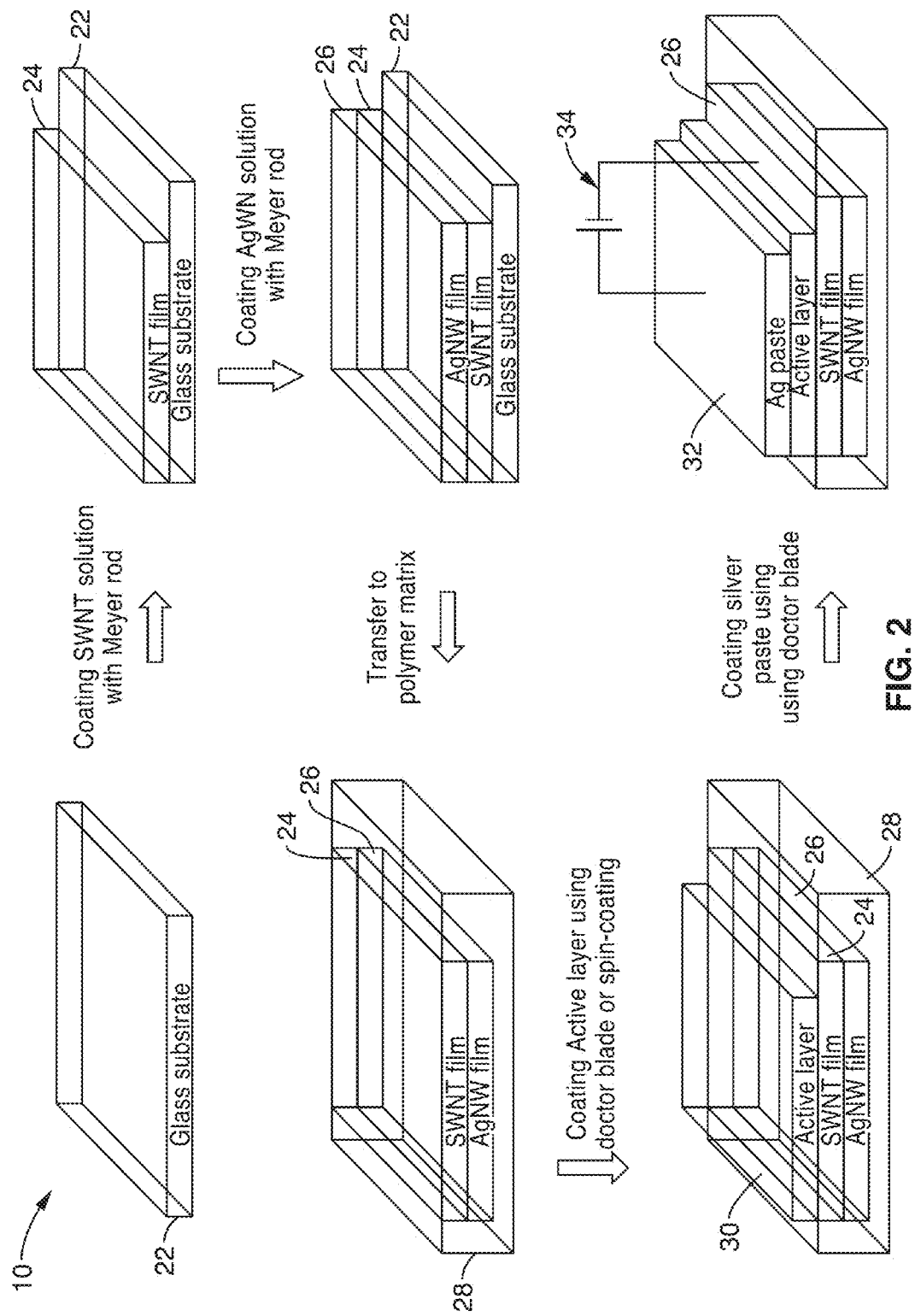
FIG. 2 is a schematic diagram of the all-solution fabrication process of a bilayer polymer composite electrode and a LEC device according to one embodiment of the technology described herein.

In order to demonstrate the functionality of the technology, LEC devices with one single walled carbon nanotube/Ag nanowires bilayer-polymer composite electrode were fabricated. Referring now to FIG. 2, a glass substrate 22 was provided and coated with a layer of single walled carbon nanotubes (SWCNT) 24 from a dispersion of nanotubes in isopropanol (IPA) and deionized water. In this procedure, 10 mg of functional SWCNTs were dispersed in 10 ml of a distilled water (DI-water) and isopropanol alcohol (IPA) mixture solution (volume ratio: DI-water/IPA=1/4) with the aid of sonication. The dispersion was subjected to centrifugation (at 8,000 rpm for 20 min) to remove undispersed SWCNT agglomerates and other large impurities. The resulting solution was then coated employing the Meyer rod on the glass release substrates to produce the SWCNT film 24.

The resulting carbon nanotube layer 24 was followed by a layer 26 of silver nanowires (AgNW)s from a dispersion of nanowires in IPA. To make the AgNW transparent conducting films, AgNWs were first dispersed in a methanol and IPA mixture solution with a concentration of around 2 mg/ml, followed by coating on glass release substrates. Both coatings were done using a Meyer rod that produced coatings with high uniformity.

The SWCNT/AgNW bilayer-polymer composite electrode has a conductive surface covered by the dense SWCNT network. The surface microstructure of a composite electrode imaged by a scanning electron microscope SEM revealed a dense, highly entangled network of SWCNTs. The underlying AgNW percolation network was also clearly seen due to the much higher conductivity of AgNW than that of SWCNT. The AgNW percolation network resembles that formed on a bare glass substrate. Compared to the sparse network of AgNW on the surface of AgNW-polymer composite electrode, the surface of the bilayer composite electrode was seen to be covered with a dense SWCNT network which should facilitate uniform charge distribution across the entire electrode surface.

The SWCNT layer 24 had a sheet resistance of 10,000 ohm/sq before the deposition of the AgNW layer. After the deposition of the AgNWs, the bilayer coatings on the glass substrate were annealed to form a highly conductive AgNW percolation network, with a total measured sheet resistance controlled in the range of 10 to 30 ohm/sq.

Thereafter, a polymer matrix 28 was created with a precursor solution containing a urethane acrylate resin (UA), a difunctional methacrylate monomer (DMA), tert-butyl acrylate (tBA), and a photo initiator that was cast on top of the SWCNT/AgNW bilayer and cured under UV light to complete the fabrication of the bilayer composite electrode.

The weight ratios of the co-monomers were adjusted to balance the mechanical strength, flexibility, transmittance, and solvent resistance of the composite electrode. The stress-strain response of the copolymer with UA:DMA:tBA weight ratio of 5:5:1 was observed. Solvent resistance of composite electrodes based on this copolymer was also evaluated. This copolymer, called poly(urethane acrylate) for convenience, was selected as the flexible substrate for device fabrication.

In one fabrication, the transparent conducting films on glass were over-coated with a precursor solution that contained 45 weight parts of UA, 45 parts of DMA, 9 parts of tBA, and 1 part of DMPA, followed by polymerizing in situ through photoinitiated free-radical polymerization. Finally, the resulting composite electrodes were peeled off the release substrate, thus the AgNWs or SWCNTs which were in contact with the glass surface were exposed on the conductive surface of the composite electrodes.

An active layer 30 was applied to the SWCNT layer 24 of the composite electrode. Active layers 30 of red or yellow light emissive polymer layers were applied to the prepared electrodes. For one construct, a luminescent polymer layer 30 comprising a red light-emitting polymer poly[2-methoxy-5-(3,7-dimethyloctyloxy)-p-phenylenevinylene] (OC1C10), admixed with ethoxylated (15) trimethylolpropanetriacrylate (ETPTA) as an ionic conductor (IC) and lithium trifluoromethane sulfonate (LiTf) as ionic source, was then coated onto the conductive surface of the composite electrode by spin or doctor-blade coating. A solution of OC1C10, ETPTA and LiTf in anhydrous tetrahydrofuran (THF) of a (weight ratio 20:5:1) with the concentration of polymer about 6 mg/ml were coated onto the composite electrodes by either spin coating at 2000 rpm for 60 seconds or doctor-blade coating (the distance between the conductive surface and blade was controlled at 100 µm) on pre-cleaned bilayer composite electrode. The films were then dried at room temperature in vacuum for 1 hour before use.

For a second construct, a yellow light-emissive polymer active layer 30 was coated on the electrode by applying a solution of phenyl substituted poly(1,4-phenylene vinylene) e.g. SuperYellow, ETPTA and LiTf in THF (weight ratio 20:4:1) with concentration of polymer about 7 mg/ml. Additionally, a solution of OC1C10, ETPTA and LiTf in THF (weight ratio 20:5:1) with the concentration of the emissive polymer about 6 mg/ml was used. These solutions were spin-coated onto the composite electrodes at 2000 rpm for 60 seconds. The films were then dried at room temperature in vacuum for 1 hour before use. The film thickness was approximately 200 nm, as measured by Dektak profilometer. Then, a layer of Al (100 nm) was deposited in a vacuum thermal evaporator through a shadow mask at a pressure of $10^{-6}$ Torr as cathode. The thickness of the active layer was controlled via the gap between the doctor-blade and the substrate surface as well as the spin-coating rate.

Finally, a pre-determined amount of Ag paste 32 was dropped cast onto one end of the light-emissive polymer layer. The doctor-blade was drawn down to spread the Ag paste to form a uniform and smooth cathode layer. The resulting coatings were dried at room temperature in a vacuum for an additional 1 hour to completely remove the solvent of the Ag paste.

The devices that were produced by the all-solution processing were characterized and compared to conventional devices. An electric potential 34 was applied to carbon nanotube layer 26 of one electrode and the Ag paste layer 32 on the other electrode for the functional evaluations.

EXAMPLE 2

The transmittance properties of the SWCNT films, bilayer films and the polymer composites were measured. A comparison of transmittance and sheet resistance performance for composite electrodes and ITO-glass electrode is tabulated in Table 1.

The transmittance spectra for the 10,000 ohm/sq SWCNT coating and various SWCNT/AgNW bilayer coatings on glass substrate were collected and evaluated. Although the SWCNT network is densely packed in stark contrast with that of the AgNW coating, the transmittance of the 10,000 $\Omega$/sq SWCNT coating at 550 nm is around 89% (inclusive of glass substrate) and the 30$\Omega$/sq sheet resistance had an 85% transmittance at 550 nm. When the sheet resistance of SWCNT coatings is lowered to 1.5 k$\Omega$/sq in thicker coatings, the transmittance would diminish to only 76% at 550 nm. To lower to less than 100 Ohm/sq, the transmittance would be less than 60% at 550 nm, which is undesirable as a transparent electrode for PLECs.

The 10,000$\Omega$/sq SWCNT coatings were selected for the preparation of the SWCNT/AgNW bilayers. The stacked SWCNT/AgNW layers exhibit a high figure-of-merit conductivity-transmittance. The transmittance of the 10 ohm/sq, 15 ohm/sq and 30 ohm/sq SWCNT/AgNW bilayer films can respectively reach 77%, 80% and 82% at 550 nm (all inclusive of substrates). The low sheet resistances are mainly the result of the AgNW percolation network.

Table 1 further shows the figure-of-merit transmittance-sheet resistance for the SWCNT/AgNW bilayer-polymer composite electrodes. It should be noted that the SWCNT/AgNW bilayer-polymer composite electrodes retain the same surface conductance as the neat coatings of SWCNT/AgNW bilayers on glass, indicating the complete transfer of SWCNT/AgNW bilayers into the copolymer matrix. In the composites, most of the SWCNT/AgNW bilayer networks are inlaid in the polymer surface, except for a small fraction of SWCNTs that are exposed on the surface.

The poly(urethane acrylate) copolymer matrix has a transmittance better than 92% in the wavelength range between 450 nm and 1100 nm. The SWCNT/AgNW bilayer-polymer composite electrodes with 10 ohm/sq, 15 ohm/sq and 30 ohm/sq sheet resistance have a transmittance of 78%, 81% and 83% at 550 nm respectively. In comparison, a 10 ohm/sq ITO/glass electrode has a transmittance of 86% at 550 nm as shown in Table 1.

EXAMPLE 3

The device structure and performance of LEO devices with ITO/glass, SWCNT-polymer composite, AgNW-polymer composite or SWCNT/AgNW bilayer-polymer composite electrode as anodes, and evaporated Al or Ag paste as cathodes were evaluated and tabulated in Table 2.

The commercial printing Ag paste has been used as the cathode in polymer LEDs. To investigate the performance of LEO devices using Ag paste as cathode, we first compared the two devices A and B of Table 2 using the same active layer (OC1C10:IC:LiTf) and anode (ITO/glass), but with evaporated Al (device A) and printing Ag paste (device B) as cathode respectively.

The current density-luminance-driving voltage characteristic curves (J-L-V) and current efficiency-luminance characteristic curves ($\eta$-L) of device A and device B, measured at a scanning voltage of 0.1 V/s, are presented with the corresponding maximum current efficiency, brightness, voltage and current density listed in Table 2.

The control device A displays a maximum current efficiency of 1.97 cd/A at 13.1 V and a maximum brightness of 1919.7 cd/m$^2$ at current density 98.3 mA/cm$^2$. Device B (ITO/OC1C10:IC:LiTf/Ag paste) has comparable turn on voltage (3.0 V at 1 cd/m$^2$ light emission density), a slightly lowered maximum brightness (1360.0 cd/m$^2$) and maximum current efficiency (1.76 cd/A) than the control device A. These results indicate that printing Ag paste is a suitable material for solution-processed cathode for LECs.

Four additional LEO devices, (C, D, E, and F of Table 2), were fabricated using evaporated Al or Ag paste as cathode, SWCNT-polymer composite electrode or AgNW-polymer composite electrode as anode to evaluate the two solution-processed composite electrodes as the LEO anode.

EXAMPLE 4

Figure 3:
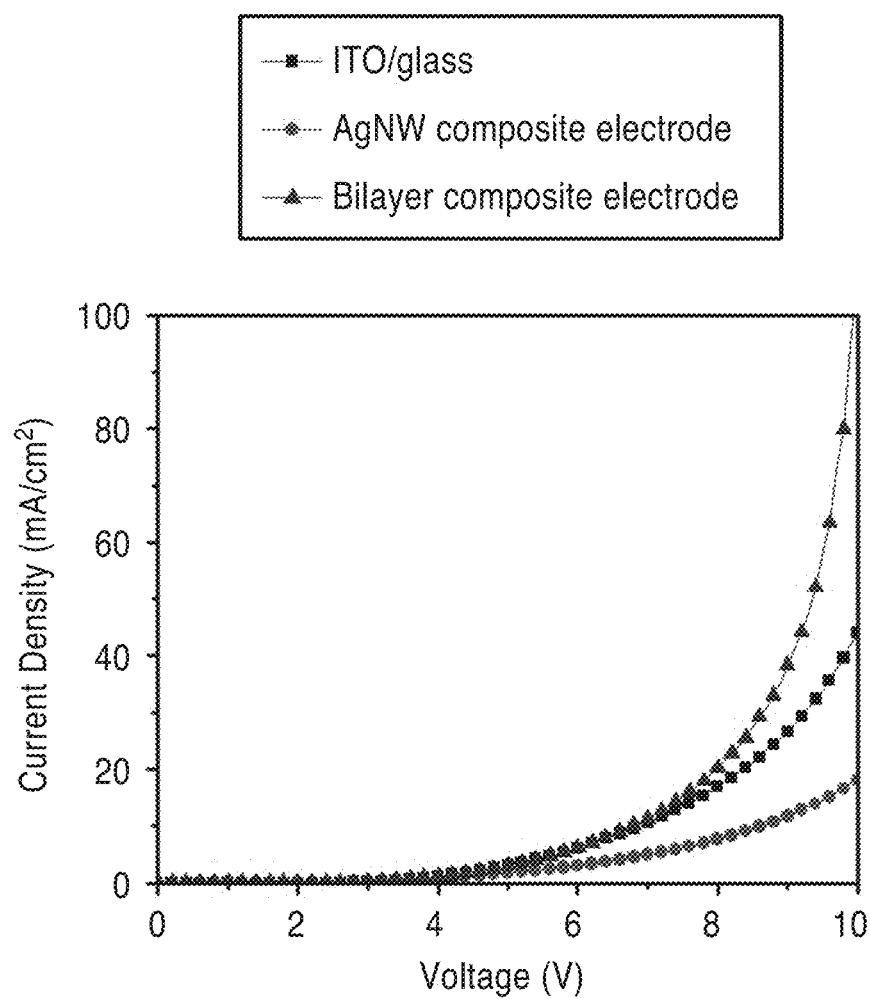
FIG. 3 is a graph of current density-driving characteristics of three types of electrodes of a PLEC device.
Figure 4:
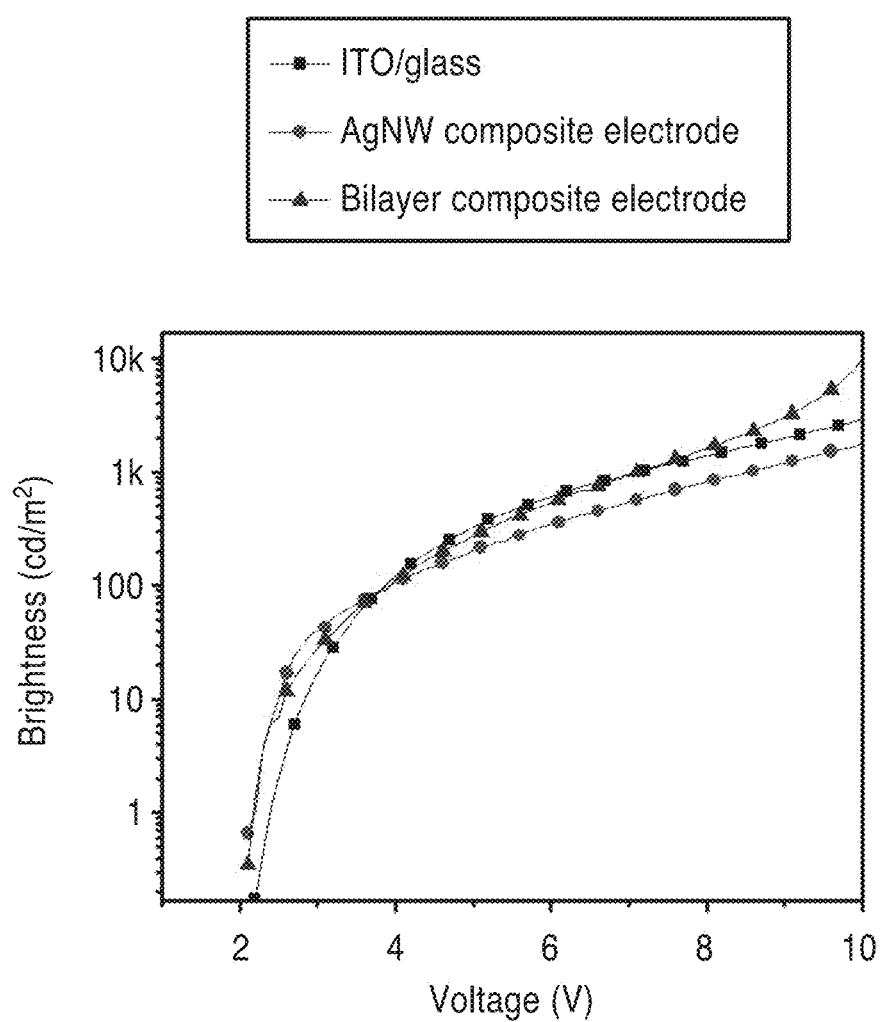
FIG. 4 is a graph of luminance-driving voltage characteristics of the three types of electrodes of a PLEC device.

The current density-driving voltage characteristics, the luminance-driving voltage characteristics and current efficiency-brightness characteristics of the devices were demonstrated with yellow PLEC devices on ITO/glass that have 15 ohm/sq AgNW-polymer composite electrode or 15 ohm/sq SWCNT/AgNW bilayer composite electrode. FIG. 3 and FIG. 4 respectively show the typical current density-driving voltage characteristic curves (J-V) and luminance-driving voltage characteristic curves (L-V) of PLEC devices processed on conventional ITO/glass, AgNW-polymer composite electrode, and bilayer composite electrode. The current efficiency-brightness characteristics of yellow PLEC devices are shown in FIG. 5 and in Table 3.

For this illustration, an electroluminescent (EL) polymer layer, comprising a yellow light-emitting polymer SuperYellow, a cross-linkable ethoxylated trimethylolpropanetriacrylate (ETPTA) as an ionic conductor and lithium trifluoromethane sulfonate (LiTf) as ionic source, was spin-coated onto the conductive surface of the composite electrodes as the anode. PLECs employing a highly cross-linkable ionic conductor can form a stable p-i-n junction within the emissive layer upon voltage bias, and thus enhance the charge injections and electroluminescent efficiency of the PLECs. A thin layer of Al was evaporated on top of the EL polymer layer as the top contact (cathode). Control devices employing ITO/glass as an anode and evaporated Al as a cathode were also fabricated for comparison. All the PLEC devices were initially charged under a constant voltage (8 V) for 10 minutes to allow the formation of a stable p-i-n junction within the EL polymer layer. The EL property of the devices was then characterized. More than 5 devices were tested for each type of devices.

It can be seen in FIG. 3 and FIG. 4 that in the voltage scan from 0-10 V, the PLEC devices exhibit characteristic turn-on of OLEDs. The turn-on voltage of the devices is ~2.2 V, regardless of the anode/substrate, and comparable to controls on ITO/glass (FIG. 4). The turn-on voltage corresponds to the band gap of the SuperYellow polymer. However, the PLEC device on AgNW-polymer composite electrode has lower current density and emission intensity than the control device at the same bias above 3.5 V. On the other hand, the device on the bilayer composite electrode resembles the control device on ITO/glass except for at high driving voltage. Devices that had the bilayer composite electrode showed higher emission intensity than that of control device when bias is higher than 7.5 V.

Figure 5:
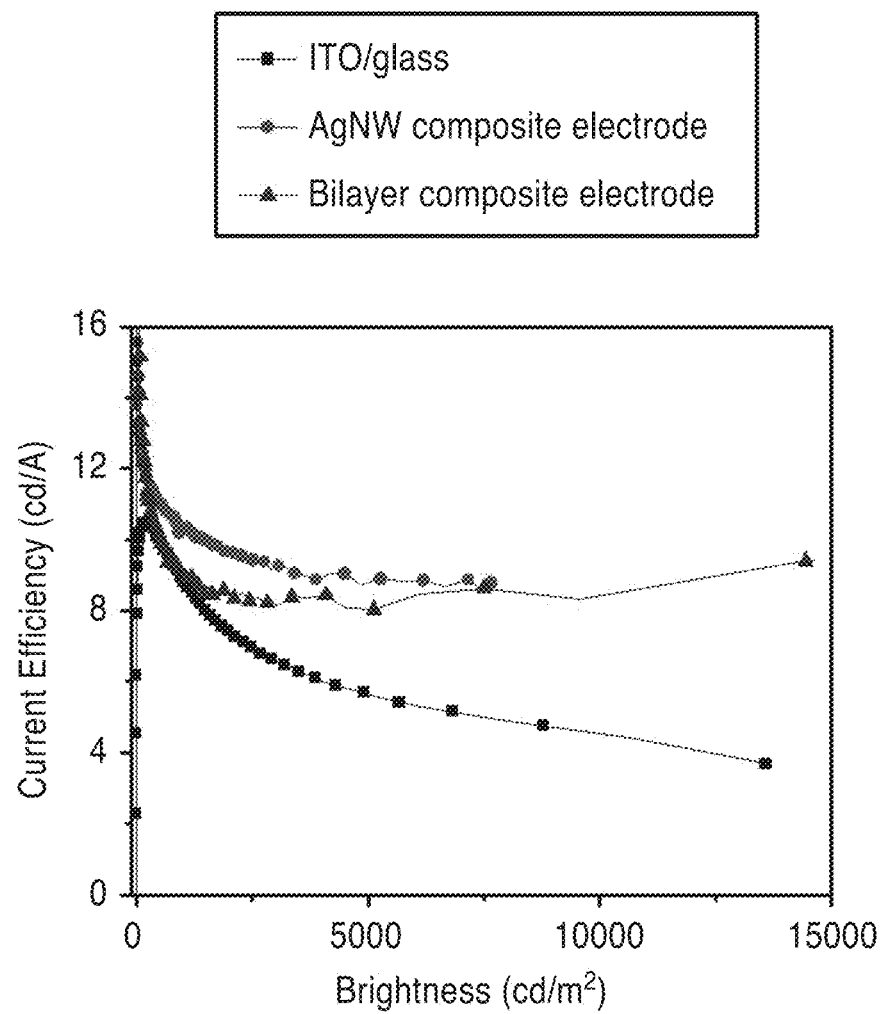
FIG. 5 is a graph of current efficiency-brightness characteristics of the three types of electrodes of a PLEC device according to the technology described herein.

The current efficiency-brightness ($\eta$-L) responses of the PLEC devices are depicted in FIG. 5 and the current efficiency values at selected brightness levels are listed in Table 3. It can be seen that the PLEC devices on the composite electrodes and ITO/glass exhibit comparable current efficiency at low brightness up to 1000 cd/m$^2$. At high brightness, the current efficiency ITO/glass PLECs diminishes rather rapidly with brightness. The efficiency of the PLECs on the SWCNT/AgNW composite electrode remains stable with brightness up to 13,000 cd/m$^2$. The higher efficiency of the PLEC on the composite electrodes than on ITO/glass may be attributed, at least in part, by surface plasmon scattering of the emitted light by AgNWs, and consequently, the out-coupling efficiency is increased. Of the two composite electrodes, PLECs on the AgNW composite can reach a maximum efficiency of 7,800 cd/m$^2$, significantly lower than the 14,600 cd/m$^2$ maximum brightness of the PLEC on the bilayer composite. The relatively stable efficiency of the PLECs on the bilayer composite electrode, between 8.1-9.2 cd/A in the luminance range of 5000-13000 cd/m$^2$ is suitable for solid state lighting applications.

The stability of the yellow PLEC devices based on the bilayer composite electrode was also evaluated under 1.5 mA/cm$^2$ constant current. The brightness of the device initially increases with time, peaks at 147 cd/m$^2$ in 60 minutes and then gradually descends to 75 cd/m$^2$ in 16 hours.

Red PLEC devices were also fabricated on the bilayer composite electrodes utilizing a similar sandwich device structure of composite electrode/EL layer/Al. The red EL polymer layer comprised a light-emitting polymer that is a commonly used red fluorescent conjugated polymer.

The current density, emission density and current efficiency characteristics of the red PLECs on bilayer composite electrode and control device measured at a scanning voltage at 0.1 V/s were collected. The red PLEC on bilayer composite electrode turned on at 3.0 V (the same as the control device), and reaches a maximum current efficiency of 2.76 cd/A at 2040 cd/m$^2$. The device showed higher current density, higher brightness, and higher current efficiency at high brightness levels than the control device on ITO/glass.

The J-L-V curve and η-L curve of the Ag paste device were measured at a scanning voltage of 0.1 V/s. This Ag paste device (ITO/OC1C10:IC:LiTt/Ag paste) has similar turn-on voltage at 3.0 V, a slightly lowered maximum brightness (1360 cd/m$^2$) and maximum current efficiency (1.76 cd/A) than the control device using ITO/glass as an anode and evaporated Al as a cathode. The characteristic J-L-V and η-L responses of the all-solution processed red PLEC using bilayer composite electrode (anode) and Ag paste (cathode) were compiled. The device had a turn-on voltage of 3.0 V, and exhibits a maximum current efficiency of 3.02 cd/A at maximum brightness of 2080 cd/m$^2$. The efficiency represents a 53% improvement over the control device. It is also higher than the device using bilayer composite electrode as an anode and evaporated Al as a cathode.

EXAMPLE 5

Unlike ITO/glass, the bilayer composite electrodes are highly flexible. A 10×10 cm$^2$ sheet could be repeatedly bent to concave and convex with 1.0 cm radius. The sheet resistance did not change much with bending. After 2000 bending cycles, the sheet resistance only increased from 15 ohm/sq to 16 ohm/sq. This high flexibility of the composite electrode coincides with a strong bonding between the SWCNT/AgNW bilayer film and the copolymer matrix. Any delamination or microstructural change would have caused significant increase in surface conductance. In addition, the Repeated Scotch Tape Peeling Test also did not affect the sheet resistance of the composite electrodes. For comparison purposes, 15 ohm/sq AgNW-polymer composite electrode with 83% transmittance at 550 nm was also prepared.

The flexibility of the all solution-processed red PLEC device and composite electrodes was also demonstrated. The PLEC devices were bent to concave and convex curvatures with 5.0 mm radius for 10 cycles. Compared to the freshly prepared device, the device after 10 cycles of bending still shows the same turn-on voltage at 3.0 V. Slight degradation of current efficiency was observed when the maximum current efficiency decreased to 2.73 cd/A as a result of the slight increase in current density and reduction in light intensity. The maximum bending curvature of the ITO electrode was limited to a 7 mm radius. The all solution-processed PLEC devices showed better flexibility than the conventional light-emitting devices using ITO as anode and evaporated Al as cathode.

EXAMPLE 6

To further demonstrate the fabrication methods and devices, solution-processed single layer PLED devices consisting of an anode, an active layer comprising a hole transport layer, an emissive layer, and an electron transport layer, and a cathode were fabricated.

In one embodiment, the AgNW/CNT bilayer-polymer composite electrode was used as the anode. In another embodiment, an AgNW-oxide particles-polymer composite electrode was used. The oxide particles are mixed with the polymer that is applied to the nanowire layer. The deposition and transfer of AgNWs are the same as described previously and the only difference is that the monomer is now blended with $BaSrTiO_3$ particles of designated concentration by using a tip sonicator. The AgNW-modified polymer composite electrode was used as the anode in this example.

Fabrication began with a dispersion of AgNWs at a concentration of 2 mg/ml in methanol that were first deposited onto a pre-cleaned glass slide and then dried at room temperature. The AgNWs had an average diameter and length of approximately 60 nm and 6 μm, respectively. The applied AgNW film was then annealed at 180° C. for 30 minutes in the open atmosphere.

In one embodiment, Ethoxylated (4) bisphenol, a dimethacrylate monomer, was cast on the AgNWs and then UV-cured to allow free radical polymerization. Due to the stronger bonding between the selected polymer and AgNWs than with glass and AgNWs, the AgNWs was transferred to the polymer to form the AgNW-polymer composite electrode.

In another embodiment, the oxide particles were $BaSrTiO_3$ with an average size diameter of 200 nm and a refractive index of around 2.5 in the visible range mixed in with the polymer.

The active layer for the devices included a hole transport material, an emissive material and an electron transport material. Low conductivity Poly (3,4-thylenedioxythiophene):poly(styrenesulfonate) (PEDOT:PSS) was selected as the hole transport material. The emissive layer was a blend of poly(vinylcarbazole) (PVK), an electron transporting material: 1,3-bis[(4-tert-butylphenyl)-1,3,4-oxidiazolyl] phenylene (OXD-7), and a phosphorescent material: tris(2-(4-tolyl)pyridinato-N,C$^2$) (Ir(mppy)$_3$).

PVK was selected as the phosphorescence material due to its high triplet energy level (3.0 eV), good film-forming properties, high glass transition temperature (Tg~160° C.), and the ability to conduct holes. Cesium fluoride (CsF) and aluminum acted as electron transport material and cathode, respectively.

The PLED devices were fabricated on the AgNW-polymer composite electrodes with a sheet resistance of around 20-30 ohm/sq. For comparison, the conventional PLEDs were fabricated on pre-cleaned indium tin oxide (ITO) coated glass substrates with a sheet resistance of ~15Ω/sq and treated with oxygen plasma under 250 mbar pressure for 30 seconds.

The PEDOT:PSS was spin-coated on the anode (ITO glass substrate or AgNW-polymer composite electrode) at 6000 rpm for 60 seconds and then baked at 130° C. for 35 minutes. The resulting coating was approximately 40 nm thick.

An emissive polymer blend layer was then spin-coated from a solution containing PVK (MW=1.1×10$^6$ g/mol), OXD-7, and phosphorescent dopants that were co-dissolved in chlorobenzene. The emissive layer, 75 nm in thickness, was annealed at 80° C. for 30 minutes.

Finally, a thin layer of CsF (1.0 nm) followed by a layer of aluminum (100 nm) was deposited in a vacuum thermal evaporator through a shadow mask at 10$^{-6}$ Torr.

The resulting single layer PLED devices had a sandwiched configuration of ITO or AgNW-polymer composite electrode/PEDOT:PSS (40 nm)/emission layer (75 nm)/CsF (1 nm)/Al (100 nm). The device thickness and active area were approximately 0.16 mm and 0.13 cm², respectively.

The efficiency of PLEDs fabricated on ITO, AgNW-polymer composite electrode, AgNW/CNT bilayer-polymer composite electrode, and AgNW-oxide particles-polymer composite electrode with 0.1 wt % BaSrTiO₃ was evaluated. The results showed that the enhanced efficiency of AgNW-polymer composite electrode and AgNW-oxide particles-polymer composite electrode compared with the ITO electrode that was observed was due to light scattering, which partially eliminated the typical waveguide effect in the substrate. However, the enhancement observed in the AgNW/CNT bilayer-polymer composite electrode is unclear. Three possible reasons are: (a) CNT produce a similar light scattering effect as the oxide particles, (b) CNT, which has higher work function than AgNWs, modifies the work function of the composite electrode, which increases the capacity for hole-injection, and (c) the CNTs can cover areas that are originally gaps in between AgNWs, and thus facilitate hole injection.

The efficiency of PLEDs fabricated on ITO, AgNW-polymer composite electrode, and AgNW-oxide particles-polymer composite electrode with various concentrations of BaSrTiO₃ particles was also evaluated. The efficiency is shown to continuously increase with increasing BaSrTiO₃ concentration even though the composite electrode is fairly opaque at higher concentrations. The enhancement is believed to be due to a light scattering effect due to the presence of particles. The scattering of photons in the composite electrode depends on several factors including particle size, particle concentration, and substrate thickness. These factors can be optimized.

Table 4 summarizes the PLEDs performance under 1000 Cd/m² and 20000 Cd/m². The best performance of PLEDs acquiring so far is sample with 1 wt % BaSrTiO₃ blending concentration, there is a doubly increase in current efficiency comparing with ITO control device (Table 4), 68.4 (Cd/A) with respect to 32.4 (Cd/A) under 20000 Cd/m². PLEDs on the AgNW-oxide particles-polymer composite electrode were also made with two different thicknesses (0.16 mm and 0.35 mm).

Accordingly, an all-solution process for fabricating PLEC and other devices is provided that coats an emissive layer and cathode from solutions on to a bilayer composite electrode by doctor-blade and spin-coating. These all-solution processed PLEC devices exhibit higher performance than control devices on ITO/glass an anode and evaporated Al as a cathode.

The anode is preferably a transparent, flexible and high-performance SWCNT/AgNW-polymer bilayer composite electrode. This bilayer composite electrode, comprising SWCNT/AgNW bilayer networks embedded in the surface layer of poly(urethane acrylate) copolymer matrix are provided that exhibits high figure-of-merit conductivity-transmittance performance and excellent mechanical flexibility. The dense SWCNT network embedded in the outer surface can distribute charges uniformly across the electrode surface area, whereas the sparsely distributed AgNW networks buried underneath the SWCNT network contribute to low sheet resistance. This bilayer composite electrode can be used to fabricate high-performance PLEC devices without the use of a conducting polymer layer to enhance hole injection.

From the discussion above it will be appreciated that the technology can be embodied in various ways, including the following:

1. A high efficiency organic light emitting device, comprising: a transparent composite electrode of a film of a conductive nanowires, carbon nanoparticles, light scattering nanoparticles and a polymer support; at least one semiconductive active layer electrically coupled to the transparent electrode; and a second electrode electrically coupled to the active layer.

2. A high efficiency organic light emitting device, comprising: a transparent composite electrode of a film of a conductive nanowires, light scattering nanoparticles and a polymer support; at least one semiconductive active layer electrically coupled to the transparent electrode; and a second electrode electrically coupled to the active layer.

3. A high efficiency organic light emitting device, comprising: a transparent composite electrode of a film of carbon nanoparticles, a film of conductive nanowires, light scattering nanoparticles and a polymer support; at least one semiconductive active layer electrically coupled to the first electrode; and a second electrode electrically coupled to the active layer.

4. The device of any previous embodiment, wherein the carbon nanoparticles are selected from the group of particles consisting of single walled carbon nanotubes, graphite powder, graphenes, and double walled carbon nanotubes.

5. The device of any previous embodiment, wherein the conductive nanowires are selected from the group of particles consisting of silver nanowires, copper nanowires, gold nanowires, stainless steel nanowires, conducting polymer nanowires and nickel nanowires.

6. The device of any previous embodiment, wherein the light scattering nanoparticles comprise nanoparticles of BaSrTiO₃.

7. The device of any previous embodiment, wherein the active layer comprises a hole transport material, an emissive material and an electron transport material.

8. The device of any previous embodiment, wherein the hole transport material comprises PEDOT:PSS, and the emissive material comprises a phosphorescent organometallic compound dispersed in a conjugated organic material.

9. The device of any previous embodiment, wherein the active layer comprises a plurality of organic semiconductor layers and a phosphorescent dopant dispersed in one of the organic semiconductor layers.

10. The device of any previous embodiment, wherein the active layer comprises a layer of a conjugated polymer and an ionic species.

11. The device of any previous embodiment, wherein the second electrode comprises a paste of conductive nanoparticles.

12. The device of any previous embodiment, wherein the second electrode is a transparent composite electrode.

13. A method for producing a high efficiency organic light emitting device, comprising: depositing a plurality of carbon nanoparticles on a smooth surface of a platform to form a carbon layer; applying a plurality of conductive nanowires to the carbon layer to form a porous bilayer; coupling the porous bilayer to a polymer matrix containing light scattering particles to form a composite film; removing the composite film from the platform; applying at least one semiconductive active layer to the carbon layer; and depositing an electrode on the active layer.

14. The method of any previous embodiment, wherein the coupling of the porous bilayer to the polymer matrix comprises: coating the porous bilayer with at least one coating of monomers, wherein at least one coating comprises light scattering particles dispersed in the monomer; and curing the monomers in situ to form the composite film.

15. The method of any previous embodiment, wherein the surface of the composite film that is removed from the surface of the platform is smooth with average surface height variations of 20 nm or less.

16. The method of any previous embodiment, wherein the polymer matrix contains a light transducing additive that absorbs light at one wavelength and re-emits light at a longer wavelength.

17. The method of any previous embodiment, wherein the polymer matrix contains dispersed light scattering nanoparticles of BaSrTiO$_3$.

18. The method of any previous embodiment, wherein the BaSrTiO$_3$ nanoparticles comprise 0.1 wt % to 1.0 wt % of the composite film.

19. The method of any previous embodiment, wherein the composite film has a conductive surface with sheet resistance lower than 50 Ohm/square.

20. A method for producing an organic light emitting device, comprising: depositing a plurality of carbon nanoparticles on a smooth surface of a platform; depositing a second plurality of conductive nanowires on the deposited carbon nanoparticles to form a porous conductive layer; incorporating light-scattering nanoparticles with either the carbon nanoparticle deposit or conductive nanowire deposit; coating the conductive layer with at least one coating of monomers; polymerizing the applied monomers to form a conductive layer-polymer composite film; removing the composite film from the platform; applying a plurality of semiconducting active layers to a conductive layer surface of the composite film; and coupling an electrode to the active layer.

21. The method of any previous embodiment, wherein the surface of the composite film that is removed from the surface of the platform is smooth with surface height variations of 20 nm or less.

22. The method of any previous embodiment, wherein the light-scattering nanoparticles incorporated in the carbon nanoparticle or conductive layers comprises BaSrTiO$_3$ nanoparticles at 0.1 wt % to 1.0 wt % of the composite film.

23. The method of any previous embodiment, wherein the carbon nanoparticles are selected from the group of nanoparticles consisting of single walled carbon nanotubes, graphite powder, graphenes, and double walled carbon nanotubes; and said conductive nanowires are selected from the group of nanoparticles consisting of silver nanowires, copper nanowires, gold nanowires, stainless steel nanowires, conducting polymer nanowires and nickel nanowires.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

| Electrodes | Transmittance @ 450 nm (%) | Transmittance @ 550 nm (%) | Transmittance @ 850 nm (%) | Sheet Resistance (Ω/sq) |
|---|---|---|---|---|
| Copolymer matrix | 92 | 92 | 93 | — |
| SWCNT-polymer composite electrode | 90 | 90 | 90 | 10000 |
| SWCNT/AgNW bilayer composite electrode 1 | 82 | 83 | 81 | 30 |
| SWCNT/AgNW bilayer composite electrode 2 | 79 | 81 | 79 | 15 |
| SWCNT/AgNW bilayer composite electrode 3 | 77 | 78 | 75 | 10 |
| ITO/glass | 76 | 86 | 79 | 10 |

TABLE 2

| No. | Device structure | Maximum current efficiency (cd/A) | Brightness (cd/m$^2$) | Voltage (V) | Current density (mA/cm$^2$) |
|---|---|---|---|---|---|
| A | ITO/OC1C10:IC:LiTf/Al | 1.97 | 1919.7 | 13.1 | 98.3 |
| B | ITO/OC1C10:IC:LiTf/Ag paste | 1.76 | 1360.0 | 9.9 | 76.7 |
| C | SWNT/OC1C10:IC:LiTf/Al | 0.16 | 62.4 | 20.0 | 39.0 |
| D | SWNT/OC1C10:IC:LiTf/Ag paste | 0.19 | 39.2 | 19.7 | 20.2 |
| E | AgNW/OC1C10:IC:LiTf/Al | 0.94 | 62.0 | 20.0 | 6.6 |
| F | AgNW/OC1C10:IC:LiTf/Ag paste | 1.19 | 71.4 | 20.0 | 6.0 |
| G | SWNT-AgNW/OC1C10:IC:LiTf/Al | 2.76 | 2040.0 | 11.1 | 73.8 |
| H | SWNT-AgNW/OC1C10:IC:LiTf/Ag paste | 3.02 | 2080.0 | 11.9 | 68.8 |

TABLE 3

| Brightness (cd/m²) | Current Efficiency (cd/A) | | |
|---|---|---|---|
| | ITO/glass | AgNW-composite | Bilayer-composite |
| 100 | 10.3 | 13.1 | 13.7 |
| 500 | 10.0 | 11.0 | 10.0 |
| 1000 | 8.9 | 10.4 | 9.0 |
| 5000 | 5.6 | 8.8 | 8.1 |
| 10000 | 4.5 | N/A | 8.7 |
| 13000 | 3.7 | N/A | 9.2 |

TABLE 4

| | Efficiency (Cd/A) Measured at 1000 (Cd/m²) | Measured at 20000 (Cd/m²) Efficiency (Cd/A) |
|---|---|---|
| ITO | 37.6 | 32.4 |
| AgNW-polymer composite | 45.2 | 43.2 |
| AgNW-0.1 wt % BaSrTiO₃-polymer composite | 54.8 | 50.8 |
| AgNW-0.5 wt % BaSrTiO₃-polymer composite | 56.9 | 56.8 |
| AgNW-1.0 wt % BaSrTiO₃-polymer composite | 59.7 | 68.4 |

I claim:

1. An organic light emitting device, comprising:
a transparent composite electrode comprising metal wires, carbon particles, light scattering particles, and a polymer support, wherein:
the carbon particles comprise at least one particle selected from a carbon nanotube, graphite powder, and graphene,
the metal wires are applied to the carbon particles to form a porous bilayer,
the polymer support comprises a polymer matrix, the polymer matrix containing the light scattering particles and the polymer matrix coupled to the porous bilayer to form a composite film;
at least one semiconductive active layer electrically coupled to the transparent electrode; and
a second electrode electrically coupled to the active layer, wherein the organic light emitting device is fabricated using a process comprising:
depositing the carbon particles on a surface of a platform to form a carbon layer;
applying the metal wires to the carbon layer to form a porous bilayer;
coupling the porous bilayer to the polymer matrix containing the light scattering particles to form the composite film;
removing the composite film from the platform, wherein the surface of the composite film that is removed from the surface of the platform is smooth with average surface height variations of 20 nm or less;
applying the at least one semiconductive active layer to the carbon layer; and
depositing the second electrode on the active layer.

2. A device as recited claim 1, wherein said light scattering particles comprise nanoparticles of BaSrTiO₃.

3. A device as recited claim 1, wherein the active layer comprises a hole transport material, an emissive material and an electron transport material.

4. A device as recited claim 3, wherein said hole transport material comprises PEDOT:PSS, and the emissive material comprises a phosphorescent organometallic compound dispersed in a conjugated organic material.

5. A device as recited claim 1, wherein the active layer comprises a plurality of organic semiconductor layers and a phosphorescent dopant dispersed in one of the organic semiconductor layers.

6. A device as recited in claim 1, wherein the active layer comprises a layer of a conjugated polymer and an ionic species.

7. A device as recited in claim 1, wherein said second electrode comprises a paste of conductive particles.

8. A method for producing an organic light emitting device, comprising:
depositing a plurality of carbon particles on a surface of a platform to form a carbon layer;
applying a plurality of conductive particles to the carbon layer to form a porous bilayer;
coupling the porous bilayer to a polymer matrix containing light scattering particles to form a composite film;
removing the composite film from the platform;
applying at least one semiconductive active layer to the carbon layer, wherein the composite film comprises a first electrode for injecting charge into the semiconductive active layer; and
depositing a second electrode on the semiconductive active layer.

9. A method as recited in claim 8, wherein said coupling of the porous bilayer to the polymer matrix comprises:
coating the porous bilayer with at least one coating of monomers, wherein at least one coating comprises light scattering particles dispersed in the monomer; and
curing the monomers in situ to form the composite film.

10. A method as recited in claim 8, wherein the surface of the composite film that is removed from the surface of the platform is smooth with average surface height variations of 20 nm or less.

11. A method as recited in claim 8, wherein the polymer matrix contains a light transducing additive that absorbs light at one wavelength and re-emits light at a longer wavelength.

12. A method as recited in claim 8, wherein the polymer matrix contains dispersed light scattering paricles of BaSrTiO₃.

13. A method as recited in claim 12, wherein the BaSrTiO₃ particles comprise 0.1 wt % to 1.0 wt % of the composite film.

14. A method as recited in claim 8, wherein the composite film has a conductive surface with sheet resistance lower than 50 Ohm/square.

15. The method of claim 8, wherein:
the carbon particles comprise at least one particle selected from a carbon nanotube, graphite powder, and graphene, and
the conductive particles comprise at least one metal chosen from silver, copper, gold, stainless steel, and nickel.

16. The method of claim 15, wherein:
the carbon particles are cast using a solvent on the platform comprising glass, a silicon wafer, a polymer sheet, or metal in a planar sheet or drum,
the conductive particles are cast using a solvent on the carbon layer, the metal wires providing a percolation network for electrical conduction, and the carbon particles covering gaps in between the metal wires.

17. A method for producing an organic light emitting device, comprising:
- depositing a plurality of carbon particles on a surface of a platform, the carbon particles comprising at least one particle chosen from a carbon nanotube, graphite powder, and graphene;
- depositing a plurality of conductive particles on the deposited carbon particles to form a porous conductive layer, the conductive particles comprising at least one wire chosen from a metal wire, a conducting polymer wire, and a ceramic conductor wire;
- incorporating light-scattering particles with either the carbon particles or the conductive particles;
- coating the porous conductive layer with at least one coating of monomers;
- polymerizing the applied monomers to form a conductive layer-polymer composite film;
- removing the composite film from the platform;
- applying a plurality of semiconducting active layers to a conductive layer surface of the composite film, wherein the composite film comprises a first electrode for injecting charge into the semiconducting active layer; and
- coupling a second electrode to the semiconductive active layers.

18. A method as recited in claim 17, wherein the surface of the composite film that is removed from the surface of the platform is smooth with surface height variations of 20 nm or less.

19. A method as recited in claim 17, wherein the light-scattering nanoparticles comprise $BaSrTiO_3$ particles at 0.1 wt % to 1.0 wt % of the composite film.

20. The method of claim 17, wherein:
- the conductive particles comprise at least one metal chosen from silver, copper, gold, stainless steel, and nickel,
- the carbon particles are cast using a solvent on the platform comprising glass, a silicon wafer, a polymer sheet, or metal in a planar sheet or drum, and
- the conductive particles are cast using a solvent on the carbon layer, the metal wires providing a percolation network for electrical conduction, and the carbon particles covering gaps in between the metal wires.

* * * * *